United States Patent
Marr et al.

(10) Patent No.: US 8,791,849 B1
(45) Date of Patent: Jul. 29, 2014

(54) DIGITAL CLOCK UPDATE METHODOLOGY FOR MULTI-NYQUIST CONSTRUCTIVE INTERFERENCE TO BOOST SIGNAL POWER IN RADIO FREQUENCY TRANSMISSION

(71) Applicant: Raytheon Company, Waltham, MA (US)

(72) Inventors: Harry B. Marr, Manhattan Beach, CA (US); Ralston S. Robertson, Northridge, CA (US); Ronak D. Shah, San Jose, CA (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 13/827,892

(22) Filed: Mar. 14, 2013

(51) Int. Cl.
*H03M 1/66* (2006.01)

(52) U.S. Cl.
CPC ........................... *H03M 1/66* (2013.01)
USPC ............................................ 341/144; 341/143

(58) Field of Classification Search
CPC ........................................................ H03M 1/66
USPC ............................................................ 341/144
See application file for complete search history.

(56) References Cited

U.S. PATENT DOCUMENTS

| | | | | |
|---|---|---|---|---|
| 6,215,430 | B1 * | 4/2001 | Smith et al. | 341/144 |
| 6,507,303 | B1 * | 1/2003 | Alelyunas et al. | 341/144 |
| 7,280,061 | B2 * | 10/2007 | Dias | 341/144 |
| 8,237,595 | B2 * | 8/2012 | Petrovic | 341/144 |

OTHER PUBLICATIONS

Datasheet, "MAX19692—12-Bit, 2.3Gsps, Muiti-Nyquist DAC with Selectable Frequency Response", Jun. 30, 2006, retrieved from the Internet: URL:http://datasheets.maximintegrated.com/en/ds/MAX19692.pfd. (23 pgs.).

Chen, et al., "Multi-Mode Sub-Nyquist Rate Digital-To-Analog Conversion for Direct Waveform Synthesis", Signal Processing Systems, 2008, SIPS 2008, IEEE Workshop on IEEE, Piscataway, NJ, USA, Oct. 8, 2008 (pp. 112-117).

Written Opinion of the International Searching Authority for International Application No. PCT/US2014/011520, filed Jan. 14, 2014, Written Opinion of the International Searching Authority mailed Apr. 11, 2014 (6 pgs.).

International Search Report for International Application No. PCT/US2014/011520, filed Jan. 14, 2014, International Search Report dated Apr. 4, 2014 and mailed Apr. 11, 2014 (3 pgs.).

* cited by examiner

*Primary Examiner* — Khai M Nguyen
(74) *Attorney, Agent, or Firm* — Christie, Parker & Hale, LLP

(57) ABSTRACT

A system for converting a digital signal to an analog signal, the digital signal having a center frequency, includes: a multi-Nyquist DAC; a clock; and a controller configured to: control the clock to generate a clock signal such that the center frequency of the digital signal is an integer multiple of half the frequency of the clock signal, the clock being configured to supply the clock signal to the multi-Nyquist DAC and to the controller; and supply the digital signal to the multi-Nyquist DAC to generate an output signal.

18 Claims, 10 Drawing Sheets

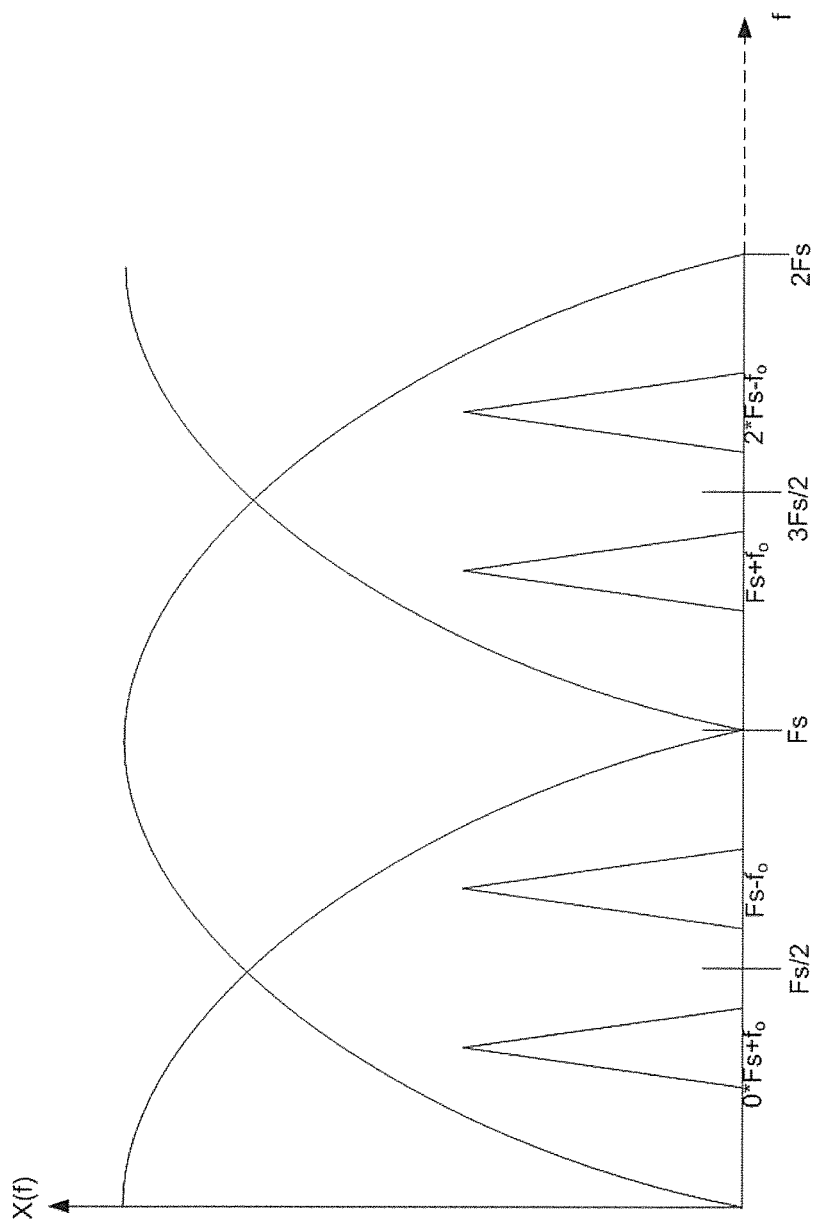

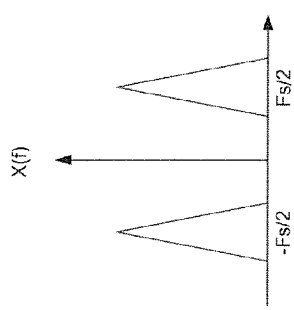
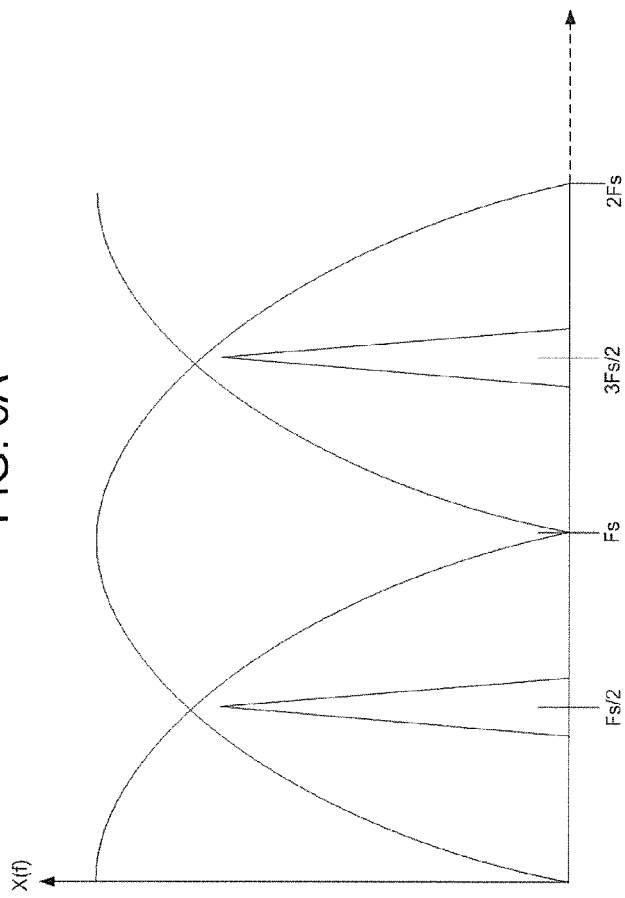

DIGITAL CLOCK UPDATE METHODOLOGY FOR MULTI-NYQUIST CONSTRUCTIVE INTERFERENCE TO BOOST SIGNAL POWER IN RADIO FREQUENCY TRANSMISSION

BACKGROUND

A digital-to-analog converter (DAC) converts an abstract finite-precision number, supplied as a plurality of bits, into a physical quantity such as an output voltage. A DAC may be used, for example, to convert a digital signal (e.g., a series of digital values) generated by a digital processor (e.g., a field programmable gate array) into a continually varying analog output signal.

Referring to FIG. 1, a DAC is generally supplied with a clock signal from an external source to set the sampling frequency Fs of the DAC. In accordance with the sampling theorem (also known as the Nyquist-Shannon sampling theorem), generally, a DAC can reconstruct a desired output analog signal if the bandwidth of the digital signal is less than the Nyquist frequency of the DAC, where the Nyquist frequency (also known as the folding frequency) is half the sampling frequency (Fs/2). A fundamental signal corresponding to the analog representation of the supplied digital signal is produced in the frequency range (or Nyquist zone labeled "Zone 0" in FIG. 2) from 0 Hz to Fs/2 Hz.

Referring to FIG. 2, a DAC typically generates higher order harmonics in multiple Nyquist Zones, for example: Zone 1: Fs/2 Hz to Fs Hz; Zone 2: Fs Hz to 3Fs/2 Hz; and Zone 3: 3Fs/2 Hz to 2Fs Hz, the higher order harmonics being labeled "$1^{st}$ Alias Signal," "$2^{nd}$ Alias Signal," and "$3^{rd}$ Alias Signal," respectively. The "fundamental signal" is centered at a center frequency $f_o$. The $1^{st}$ Alias Signal is located at Fs–$f_o$, the $2^{nd}$ Alias Signal at Fs+$f_o$, and the $3^{rd}$ Alias Signal at 2Fs–$f_o$.

As shown in FIG. 3, in order to remove the higher order harmonics from the output signal, the output is typically filtered using an anti-aliasing filter (e.g., a low-pass filter). A DAC is typically operated in a frequency range far away from the Nyquist frequency of the DAC because operating close to the Nyquist frequency would place the $1^{st}$ alias signal close to the fundamental signal, thereby making it difficult to filter the output to isolate the desired output signal.

By using a multi-Nyquist DAC, the output frequency range of the DAC can be extended without changing the sample rate Fs by using an anti-aliasing filter (e.g., a band pass filter) to select the signal in the desired frequency range such that frequencies up to four times the Nyquist rate (i.e., twice the sampling rate) can be generated. For example, as shown in FIG. 4, the fundamental, $1^{st}$ alias, and $3^{rd}$ alias signals are filtered out using an anti-aliasing filter (e.g., a band-pass filter) to leave only the $2^{nd}$ alias signal at Fs+$f_o$. However, operating a multi-Nyquist DAC in this way can cause a large drop in output power, as a significant energy is generated in the unused aliases (e.g., the fundamental signal, the $1^{st}$ alias, and the $3^{rd}$ alias which are filtered out in FIG. 4) and then filtered out by the anti-aliasing filter.

While higher output powers may be possible using analog amplification of the filtered output signal, analog amplification becomes complicated and costly if the signals being amplified are not at a reasonably flat power profile. For example, an analog amplifier intended to amplify a 1 µV signal would likely saturate with a 10 mV signal input. As such, all content generated through the DAC would need to be within 40 dB in signal power.

Prior attempts to increase output power have included using different DAC filtering modes such as Return to Zero (RZ), Non Return to Zero (NRZ) and RF. However, these techniques have a limited range of output power capability.

As such, it would be useful to be able to improve the output power and signal to noise ratio of the output of a DAC in a wide array of circumstances such as radar, communications devices, and other devices that emit analog radio frequency signals.

SUMMARY

Embodiments of the present invention use constructive interference of signal aliases of a multi-Nyquist digital-to-analog converter to increase output signal power. For example, according to one embodiment of the present invention, a variable clock is supplied to a multi-Nyquist DAC and a processor (e.g., a field programmable gate array or FPGA) feeding signals into the DAC such that the target output frequency occurs at the Nyquist frequency (which is exactly half the sampling frequency Fs). At this frequency, the fundamental signal and a first alias respectively from the zeroth and first Nyquist zones (e.g., from 0 to Fs/2 and from Fs/2 to Fs) constructively interfere to produce a single signal having up to double the expected output power from a standard DAC implementation.

As mentioned above in the background, an analog amplifier intended to amplify a 1 µV signal would likely saturate with a 10 mV signal input. As such, all content generated through the DAC would need to be within 40 dB in signal power. Embodiments of the present invention allow input signals up to 1,000 MHz wider instantaneous bandwidth while still satisfying this requirement.

Embodiments of the present invention may be used in a variety of circumstances including: radar, jammer, cell phones, and other devices which produce or emit analog RF signals.

According to some embodiments of the present invention, a phase locked loop (PLL) may be used to generate the variable clock signal supplied to the multi-Nyquist DAC and the processor.

According to one embodiment of the present invention, a system for converting a digital signal to an analog signal, the digital signal having a center frequency, includes: a multi-Nyquist DAC; a clock; and a controller configured to: control the clock to generate a clock signal such that the center frequency of the digital signal is an integer multiple of half of the frequency of the clock signal, Fs/2, the clock being configured to supply the clock signal to the multi-Nyquist DAC and to the controller; and supply the digital signal to the multi-Nyquist DAC to generate an output signal.

The output signal may include a first signal centered at the center frequency and a second signal centered at an integer multiple of the center frequency.

The system may further include an anti-aliasing filter configured to filter the output signal.

The anti-aliasing filter may be a low-pass filter configured to pass the first signal in a first Nyquist zone of the DAC and to filter out signals in all Nyquist zones other than the first Nyquist zone.

The anti-aliasing filter may be a band-pass filter configured to pass the second signal in a second Nyquist zone and to filter out signals from all Nyquist zones other than the second Nyquist zone.

The anti-aliasing filter may be a tunable filter configured to be tunable to pass signals in a tuned Nyquist zone and to filter out signals from all other Nyquist zones.

The clock may be a phase-locked loop.

The controller may be a field programmable gate array.

The digital signal may have a bandwidth less than 100 Hz.

According to another embodiment of the present invention, a method of generating an analog output signal from a digital signal centered at a center frequency, includes: supplying a clock signal to a multi-Nyquist DAC, such that the center frequency is an integer multiple of half of the frequency of the clock signal, setting a sampling rate of the multi-Nyquist DAC in accordance with the clock signal; and supplying the digital signal to the multi-Nyquist DAC to generate the analog output signal.

The output signal may include a first signal centered at the center frequency and a second signal centered at an integer multiple of the center frequency.

The method may further include anti-aliasing filtering the analog output signal.

The anti-aliasing filtering may include low-pass filtering the analog output signal to pass the first signal in a first Nyquist zone of the DAC and to filter out signals in all other Nyquist zones.

The anti-aliasing filtering may include band-pass filtering the analog output signal to pass the second signal in a second Nyquist zone and to filter out signals in all other Nyquist zones.

The anti-aliasing filtering may include: selecting a signal from among the first signal and the second signal; and tuning a tunable filter to pass one of the first signal and the second signal.

The clock signal may be generated by a phase-locked loop.

The digital signal may be supplied by a field programmable gate array.

BRIEF DESCRIPTION OF THE DRAWINGS

The accompanying drawings, together with the specification, illustrate exemplary embodiments of the present invention, and, together with the description, serve to explain the principles of the present invention.

FIG. 5C is a graph illustrating the signal $F\{Cos(2\pi f_o t)\}$ going through a multi-Nyquist aliasing DAC.

FIG. 6A is a graph illustrating a signal $F\{Cos(2\pi f_o t)\}$ (having a fundamental frequency of $f_o$) in the frequency domain, where $f_o$ has the value Fs/2 such that the signal has the form $F\{Cos(2\pi(Fs/2)t)\}$ according to one embodiment of the present invention.

FIG. 6B is a graph illustrating the result of supplying the signal $F\{Cos(2\pi(Fs/2)t)\}$ to a multi-Nyquist DAC running at a sampling frequency of Fs, according to one embodiment of the present invention.

DETAILED DESCRIPTION

Figure 1:
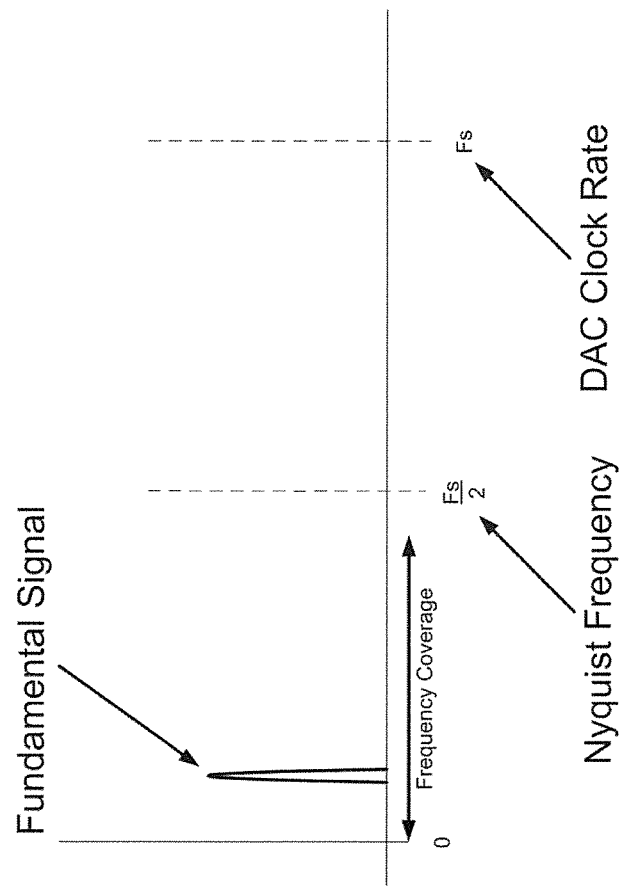
FIG. 1 is a graph of a power spectrum of the output of a DAC outputting a fundamental signal.
Figure 2:
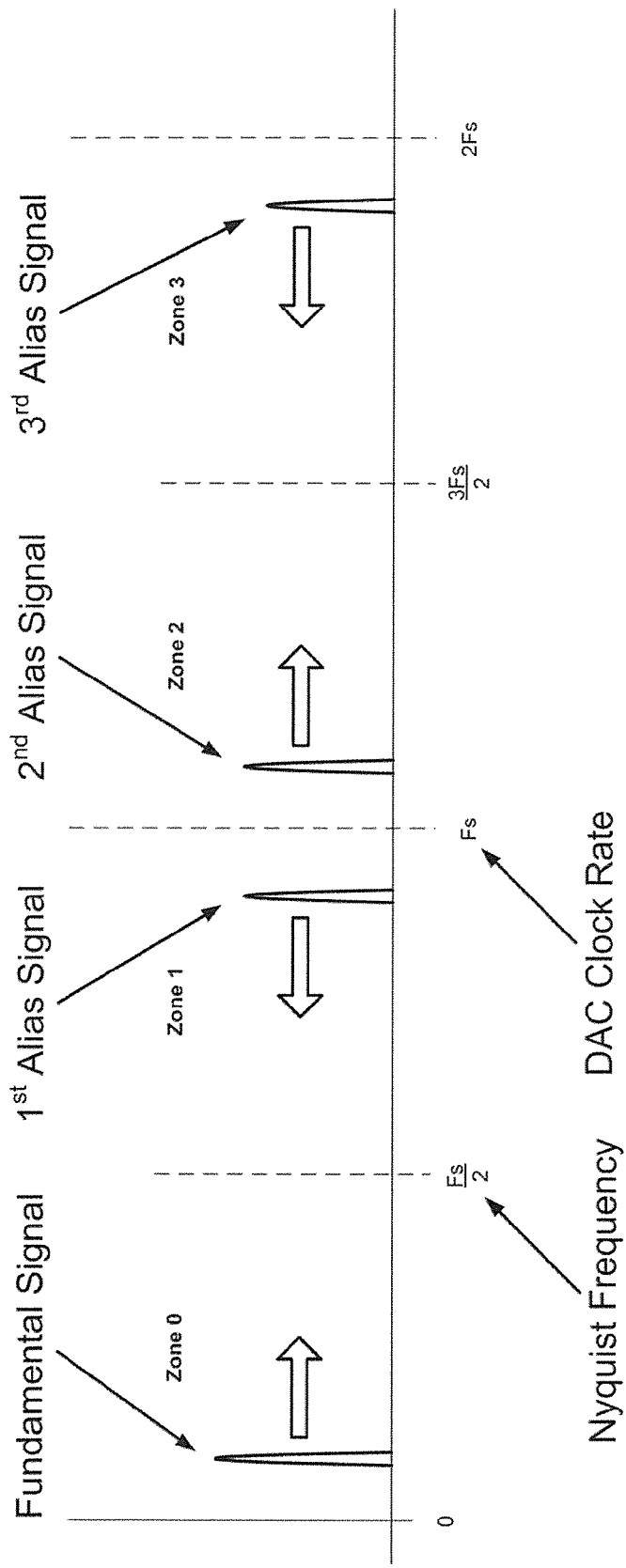
FIG. 2 is a graph illustrating a power spectrum of the output of a DAC in the range 0 to 2Fs.
Figure 3:
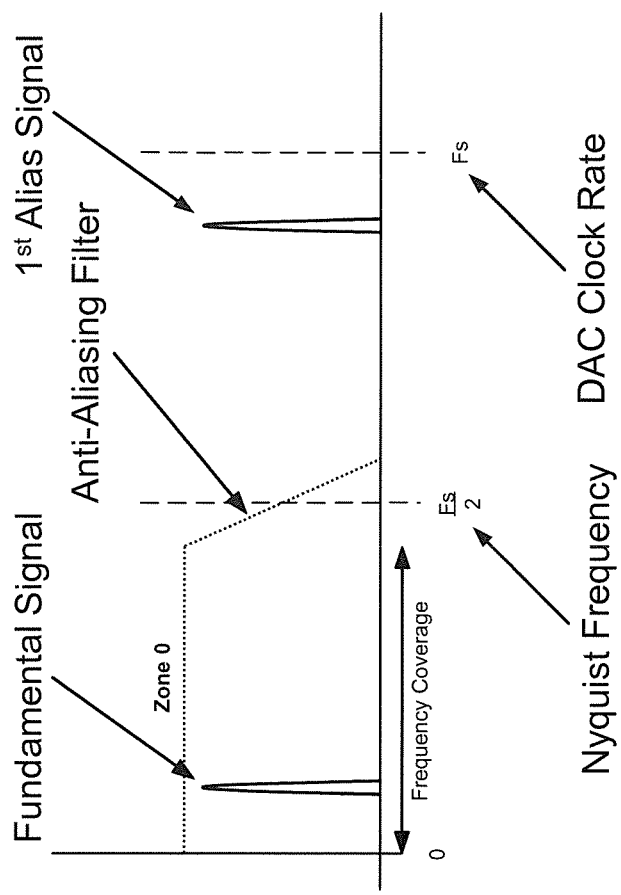
FIG. 3 is a graph illustrating filtering the output of a DAC to remove alias signals such as the 1$^{st}$ alias signal.
Figure 4:
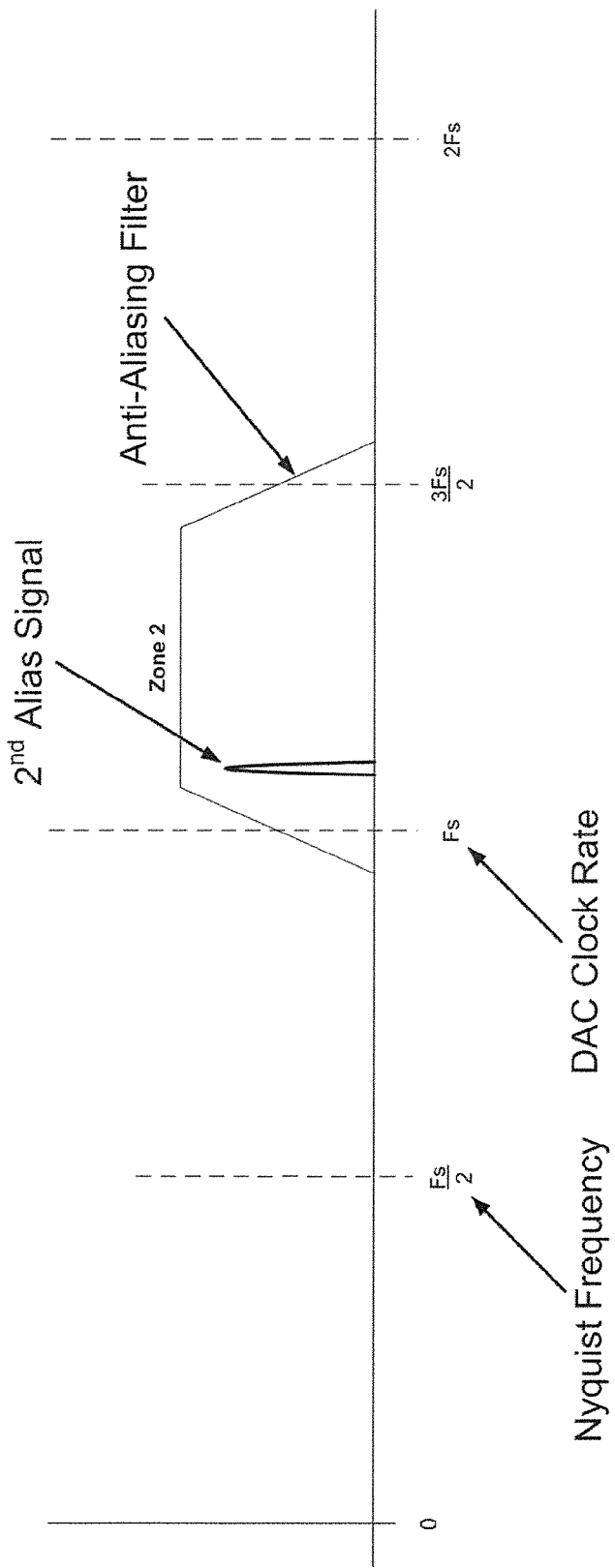
FIG. 4 is a graph illustrating filtering the output of a DAC to remove signals other than the 2$^{nd}$ alias signal.

In the following detailed description, only certain exemplary embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

Aspects of embodiments of the present invention are directed to a system for increasing the power output of a multi-Nyquist DAC through the use of constructive interference. According to some embodiments of the present invention, a DAC sampling frequency is adjusted such that the target output frequency is at the edge of the Nyquist zone, resulting in constructive interference between a frequency and its alias, thereby boosting output power. Examples of multi-Nyquist DACs include the Maxim Integrated™ MAX5879 14-Bit, 2.3 Gsps Direct RF Synthesis DAC with Selectable Frequency Response and the Maxim Integrated™ MAX19692 12-Bit, 2.34 Gsps Multi-Nyquist DAC.

Figure 5A:
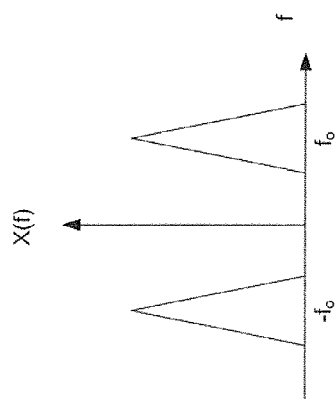
FIG. 5A is a graph illustrating a signal $F\{Cos(2\pi f_o t)\}$.
Figure 5B:
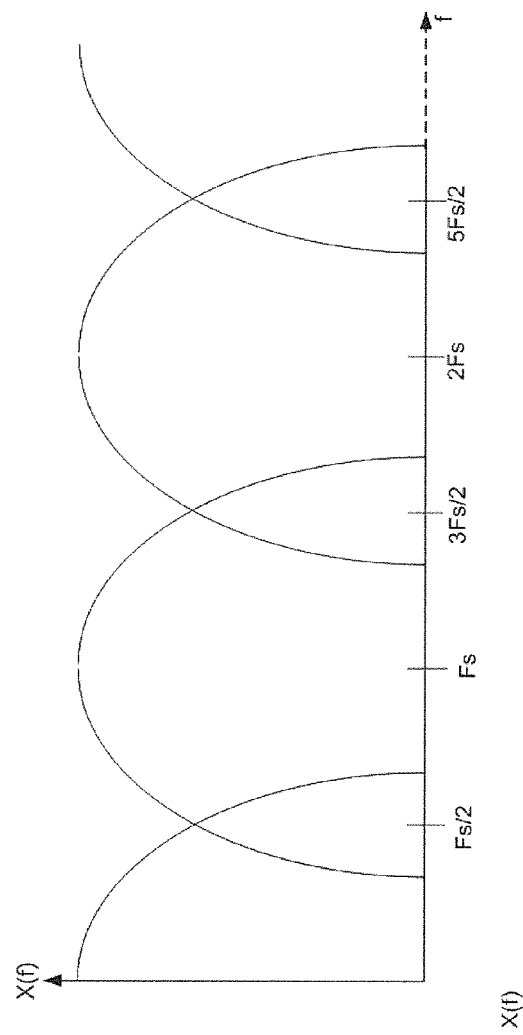
FIG. 5B is a graph illustrating the frequency response of a multi-Nyquist aliasing DAC running at a sampling frequency (or sampling rate) Fs.

FIG. 5A is a graph illustrating a signal $F\{Cos(2\pi f_o t)\}$ (having a fundamental frequency of $f_o$) in the frequency domain. FIG. 5B is a graph illustrating the frequency response of a multi-Nyquist aliasing DAC running at a sampling frequency (or sampling rate) Fs.

FIG. 5C is a graph illustrating the signal $F\{Cos(2\pi f_o t)\}$ going through a multi-Nyquist aliasing DAC. As discussed above, a multi-Nyquist DAC supplied with a signal having a fundamental frequency of $f_o$ ($0*Fs+f_o$, as shown in FIG. 5C) will generate aliases at $Fs-f_o$, $Fs+f_o$, and $2*Fs-f_o$.

FIG. 6A is a graph illustrating a signal $F\{Cos(2\pi f_o t)\}$ (having a fundamental frequency of $f_o$) in the frequency domain, where $f_o$ has the value Fs/2 such that the signal has the form $F\{Cos(2\pi(Fs/2)t)\}$. FIG. 6B is a graph illustrating the result of supplying the signal $F\{Cos(2\pi(Fs/2)t)\}$ to a multi-Nyquist DAC running at a sampling frequency of Fs, according to one embodiment of the present invention. As discussed in reference to FIG. 5B, the fundamental frequency is produced at $0*Fs+f_o$ and the first alias is produced at $Fs-f_o$. Therefore, when $f_o$ has the value Fs/2, the multi-Nyquist DAC produces a signal having a fundamental frequency at Fs/2, a first alias at Fs−Fs/2=Fs/2, a second alias at Fs+Fs/2=3Fs/2, and a third alias at 2Fs−Fs/2=3Fs/2. As seen in FIG. 6B, the signal at the fundamental frequency and the first alias constructively interfere to produce a signal at Fs/2, and the second and third aliases constructively interfere to produce another signal at 3Fs/2, where the produced signals at Fs/2 and 3Fs/2 have higher power than any of the signal at the fundamental frequency, the first alias, the second alias, or the third alias, individually. An anti-aliasing filter can then be applied to the output of the DAC to isolate the desired signal (e.g., Fs/2 or 3Fs/2).

According to one embodiment of the present invention, to place the fundamental frequency $f_o$ of the signal at the frequency Fs/2, the sampling frequency Fs of the DAC is set at $2*f_o$ while the digital signal corresponding to $F\{Cos(2\pi(Fs/2)t)\}$ is supplied to the multi-Nyquist DAC.

As such, the output power of the desired signal is increased and may be almost doubled by constructive interference. In addition, uncorrelated noise is not amplified using this technique, thereby increasing the signal to noise ratio of the output signal.

In some embodiments of the present invention, the instantaneous bandwidth of the given signal is no more than a hundred hertz.

Figure 7:
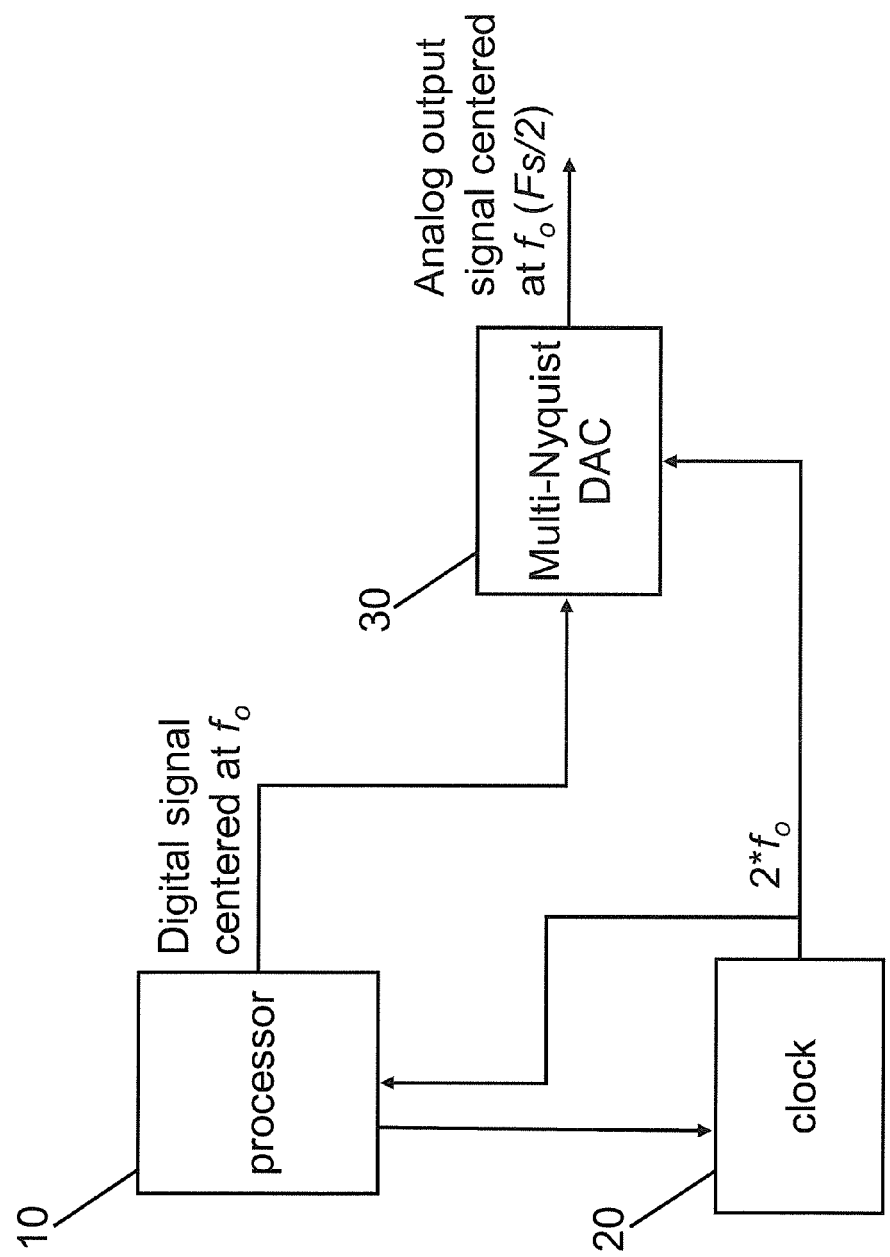
FIG. 7 is a block diagram illustrating a system for boosting signal power using a multi-Nyquist DAC according to one embodiment of the present invention.

Referring to FIG. 7, according to one embodiment of the present invention, a system for generating an analog signal from a digital signal includes a processor 10 such as a field programmable gate array (FPGA), a clock 20 such as a phase locked loop (PLL), and a multi-Nyquist DAC 30. The processor 10 is configured to generate a digital signal having a frequency centered at $f_o$. The processor 10 is also configured to control the clock 20 to generate a clock signal having a frequency of $2f_o$ and the clock 20 is configured to supply the clock signal to the processor 10 and the multi-Nyquist DAC 30, where the clock signal is used to set the sampling frequency (or sampling rate) Fs of the multi-Nyquist DAC 30.

As such, the processor 10 is configured to control the clock to set the sampling rate of the multi-Nyquist DAC 30 to a frequency that results in constructive interference within the multi-Nyquist DAC 30 to increase the output power. This can be accomplished by setting the output frequency of the clock 20 to $2f_o$, as shown in the embodiment of FIG. 7. The output of the multi-Nyquist DAC 30 can then be anti-aliasing filtered to select the desired signal (e.g., the signal at $Fs/2=f_o$ or the signal at $3Fs/2=3f_o$).

Figure 8:
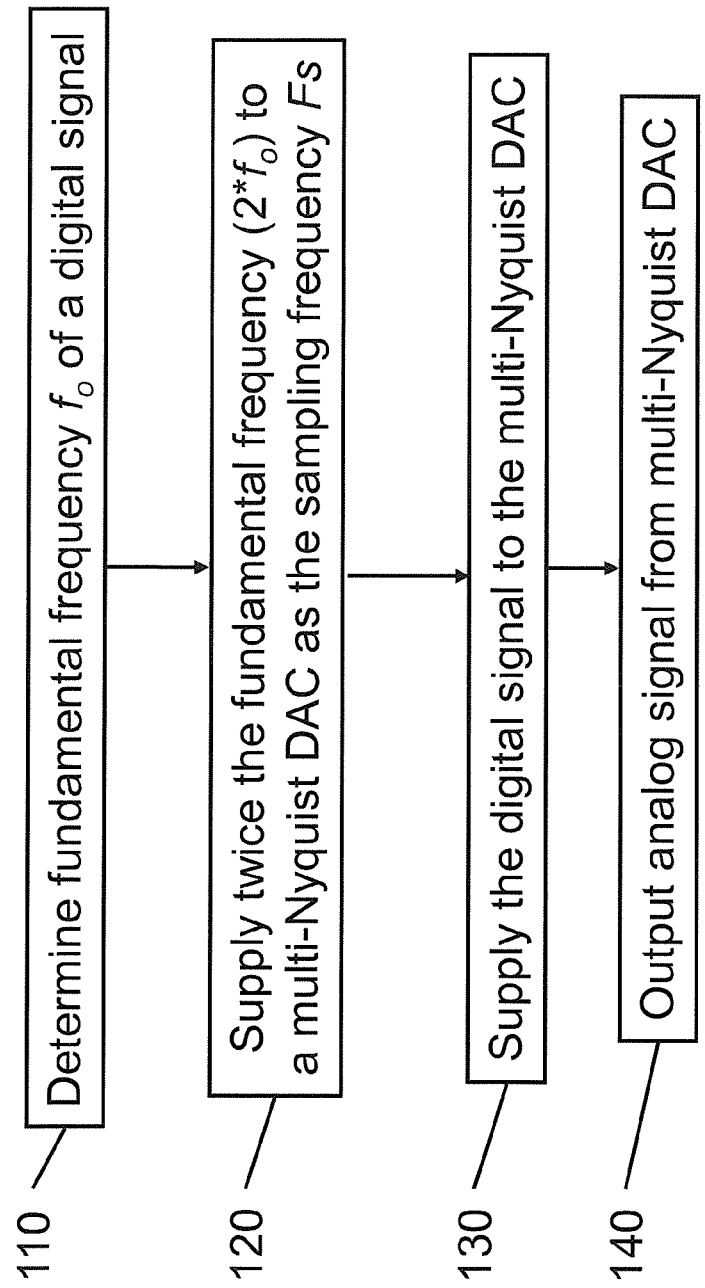
FIG. 8 is a flowchart illustrating a method of boosting signal power output using a multi-Nyquist DAC according to another embodiment of the present invention.

FIG. 8 is a flowchart illustrating a method of boosting signal power output using a multi-Nyquist DAC according to another embodiment of the present invention. A method of driving a multi-Nyquist DAC includes determining 110 a fundamental frequency $f_o$ of a digital signal; supplying (120) twice the fundamental frequency $f_o$ of the signal (i.e., $2f_o$) to a multi-Nyquist DAC as the sampling frequency Fs of the multi-Nyquist DAC; supplying 130 the digital signal to the multi-Nyquist DAC; and outputting 140 an analog signal from the multi-Nyquist DAC. The analog signal output from the multi-Nyquist DAC may include a first signal at a frequency $f_o$ and a second signal at a frequency $3f_o$. The output can that be anti-aliasing filtered to output either the signal at $f_o$ or the signal at $3f_o$.

Figure 9:
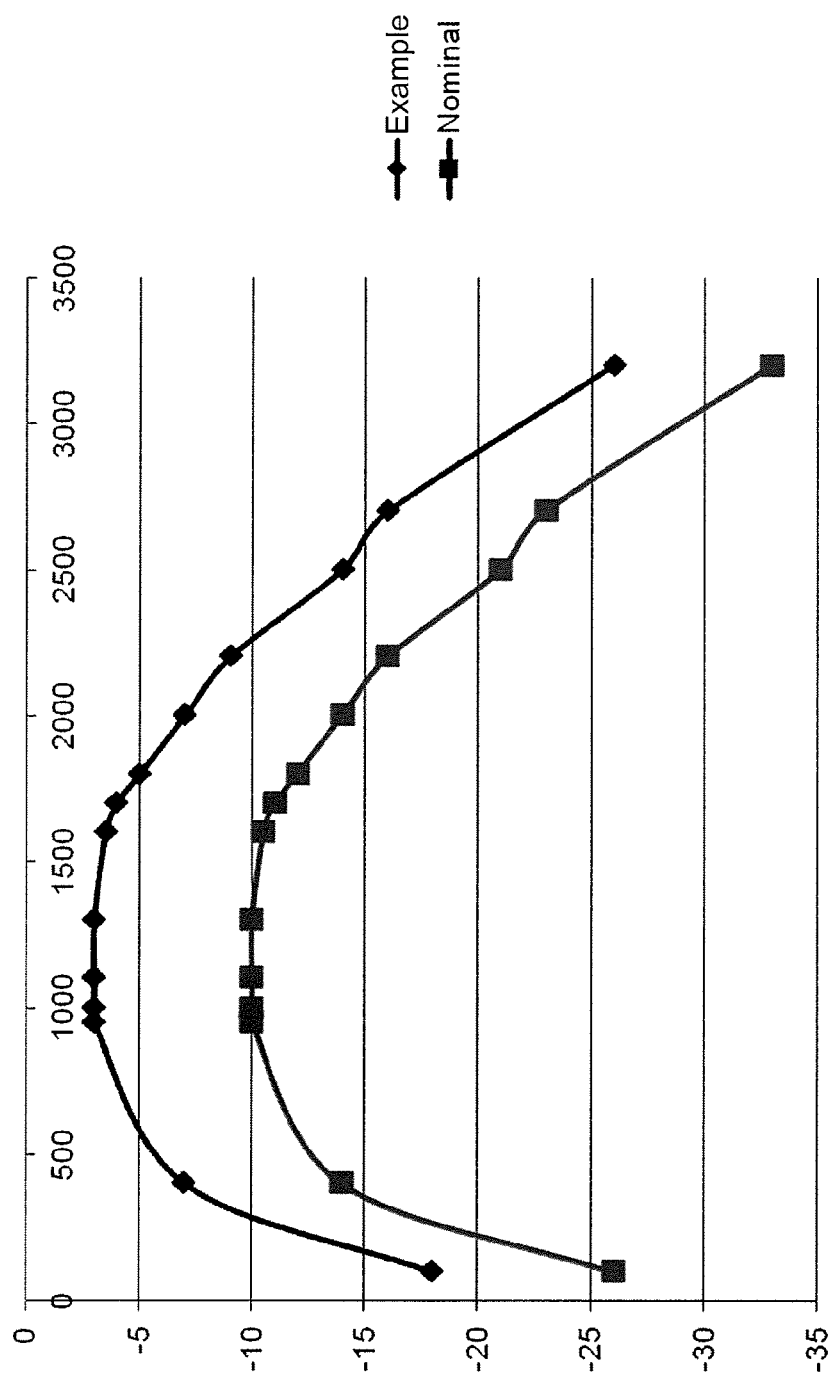
FIG. 9 is a graph comparing simulated output power of embodiments of the present invention against a standard operating mode of a DAC.

FIG. 9 is a graph comparing simulated output power of embodiments of the present invention against a standard operating mode of a DAC. As seen in FIG. 9, one embodiment of the present invention (labeled "Example" in FIG. 9) provides a power boost of about 7 to 8 dB over a conventionally driven DAC (labeled "Nominal" in FIG. 9) for a given frequency (or, equivalently, an increase in frequency of about 500 to 1,000 MHz for a given power). The simulations were performed using a MATLAB/Simulink model by developing a model at the digital level and analyzing the spectrum with respect to true time delay. Verification was performed by performing a bit-by-bit comparison of the MATLAB/Simulink model with the firmware Modelsim simulation.

In addition, an embodiment of the present invention has also been successfully tested and operated on hardware. A WILDSTAR6 OpenVPX chassis from Annapolis Micro Systems, Inc. was customized to hold a 2.3 GSPS multi-Nyquist DAC card, the DAC card containing a PowerPC processor and a Virtex 6 FPGA.

In other embodiments, the center frequency $f_o$ of the incoming digital signal may be equal to any integer multiple of half the sampling signal Fs (clock) e.g., $f_o=n*Fs/2$, where n is a positive, non-zero integer $\{1, 2, 3, \ldots\}$.

Although the above described embodiments use a digital clock, embodiments of the present invention are not limited thereto and include other embodiments in which the sampling rate of the DAC is dynamically updated using, for example, a digitally controlled phase locked loop, a counter, or any other technique known to person of ordinary skill in the art to provide a sampling pulse to the DAC. Embodiments of the present invention also are not limited to the sampling frequency of the DAC described above; other embodiments of the present invention may use slower sampling speeds down to zero hertz or higher sampling rates. Embodiments of the present invention are not limited to any particular maximum sampling rates.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A system for converting a digital signal to an analog signal, the digital signal having a center frequency, the system comprising:
   a multi-Nyquist DAC;
   a clock; and
   a controller configured to:
      control the clock to generate a clock signal such that the center frequency of the digital signal is an integer multiple of half the frequency of the clock signal, the clock being configured to supply the clock signal to the multi-Nyquist DAC and to the controller; and
      supply the digital signal to the multi-Nyquist DAC to generate an output signal.

2. The system of claim 1, wherein the output signal comprises a first signal centered at the center frequency and a second signal centered at an integer multiple of the center frequency.

3. The system of claim 2, further comprising an anti-aliasing filter configured to filter the output signal.

4. The system of claim 3, wherein the anti-aliasing filter is a low-pass filter configured to pass the first signal in a first Nyquist zone of the DAC and to filter out signals in all Nyquist zones other than the first Nyquist zone.

5. The system of claim 3, wherein the anti-aliasing filter is a band-pass filter configured to pass the second signal in a second Nyquist zone and to filter out signals from all Nyquist zones other than the second Nyquist zone.

6. The system of claim 3, wherein the anti-aliasing filter is a tunable filter configured to be tunable to pass signals in a tuned Nyquist zone and to filter out signals from all other Nyquist zones.

7. The system of claim 1, wherein the clock is a phase-locked loop.

8. The system of claim 1, wherein the controller is a field programmable gate array.

9. The system of claim 1, wherein the digital signal has a bandwidth less than 100 Hz.

10. A method of generating an analog output signal from a digital signal centered at a center frequency, the method comprising:
    supplying a clock signal to a multi-Nyquist DAC, such that the center frequency is an integer multiple of half of the frequency of the clock signal,
    setting a sampling rate of the multi-Nyquist DAC in accordance with the clock signal; and
    supplying the digital signal to the multi-Nyquist DAC to generate the analog output signal.

11. The method of claim 10, wherein the output signal comprises a first signal centered at the center frequency and a second signal centered at an integer multiple of the center frequency.

12. The method of claim 11, further comprising anti-aliasing filtering the analog output signal.

13. The method of claim 12, wherein the anti-aliasing filtering comprises low-pass filtering the analog output signal to pass the first signal in a first Nyquist zone of the DAC and to filter out signals in all other Nyquist zones.

14. The method of claim 12, wherein the anti-aliasing filtering comprises band-pass filtering the analog output signal to pass the second signal in a second Nyquist zone and to filter out signals in all other Nyquist zones.

15. The method of claim 12, wherein the anti-aliasing filtering comprises:
   selecting a signal from among the first signal and the second signal; and
   tuning a tunable filter to pass one of the first signal and the second signal.

16. The method of claim 10, wherein the clock signal is generated by a phase-locked loop.

17. The method of claim 10, wherein the digital signal is supplied by a field programmable gate array.

18. The method of claim 10, wherein the digital signal has a bandwidth less than 100 Hz.

* * * * *